United States Patent
Kim

(10) Patent No.: US 8,974,601 B2
(45) Date of Patent: Mar. 10, 2015

(54) APPARATUSES, SYSTEMS AND METHODS FOR TREATING SUBSTRATE

(75) Inventor: Hyung Joon Kim, Gyeonggi-do (KR)

(73) Assignee: Semes Co., Ltd., Chungcheongnam-do (KR)

(*) Notice: Subject to any disclaimer, the term of this patent is extended or adjusted under 35 U.S.C. 154(b) by 0 days.

(21) Appl. No.: 13/559,797

(22) Filed: Jul. 27, 2012

(65) Prior Publication Data

US 2013/0026135 A1 Jan. 31, 2013

(30) Foreign Application Priority Data

Jul. 29, 2011 (KR) .................. 10-2011-0076208
Dec. 2, 2011 (KR) .................. 10-2011-0128270

(51) Int. Cl.
*C23C 16/50* (2006.01)
*C23C 16/458* (2006.01)
*H01L 21/67* (2006.01)

(52) U.S. Cl.
CPC .... *H01L 21/67109* (2013.01); *H01L 21/67167* (2013.01); *H01L 21/67184* (2013.01); *H01L 21/67196* (2013.01)
USPC ..................................... 118/719; 156/345.32

(58) Field of Classification Search
CPC ............... C23C 16/54; C23C 14/4412; H01L 21/67069; H01L 21/67745; H01L 21/67167
USPC ..................................... 118/719; 156/345.32
See application file for complete search history.

(56) References Cited

U.S. PATENT DOCUMENTS

| | | | | | |
|---|---|---|---|---|---|
| 5,981,399 | A | * | 11/1999 | Kawamura et al. | 438/715 |
| 2004/0105737 | A1 | * | 6/2004 | Ozawa et al. | 414/217 |
| 2005/0006230 | A1 | * | 1/2005 | Narushima et al. | 204/298.2 |
| 2006/0196422 | A1 | * | 9/2006 | Hiroki | 118/719 |

FOREIGN PATENT DOCUMENTS

| | | |
|---|---|---|
| CN | 1902031 A | 1/2007 |
| CN | 101246833 A | 8/2008 |
| JP | 03-274746 A | 12/1991 |
| JP | 05-347282 A | 12/1993 |
| JP | 08-111449 A | 4/1996 |
| JP | 09-219431 A | 8/1997 |
| JP | 2000-150618 A | 5/2000 |
| JP | 2008-535262 A | 8/2008 |
| JP | 2008-235660 A | 10/2008 |
| JP | 2008-258650 A | 10/2008 |
| KR | 10-2006-0088909 A | 8/2006 |
| KR | 10-0758298 B1 | 9/2007 |
| KR | 100839911 B1 | 6/2008 |
| KR | 10-2010-0030052 A | 3/2010 |
| TW | 442891 B | 6/2001 |
| TW | 200837509 A | 9/2008 |

* cited by examiner

*Primary Examiner* — Karla Moore
*Assistant Examiner* — Nathan K Ford
(74) *Attorney, Agent, or Firm* — Carter, DeLuca, Farrell & Schmidt, LLP

(57) ABSTRACT

Provided is an apparatus, system and method for treating a substrate, and more particularly, a substrate treating apparatus having a cluster structure, a substrate treating system, and a substrate treating method using the substrate treating system. The substrate treating apparatus includes a load port on which a container containing a substrate is installed, a plurality of process modules treating the substrate, a transfer module disposed between the load port and the process modules, and transferring the substrate between the container and the process modules, and a buffer chamber disposed between neighboring ones of the process modules, and providing a space for carrying the substrate between the neighboring process modules.

9 Claims, 14 Drawing Sheets

APPARATUSES, SYSTEMS AND METHODS FOR TREATING SUBSTRATE

CROSS-REFERENCE TO RELATED APPLICATIONS

This U.S. non-provisional patent application claims priority under 35 U.S.C. §119 of Korean Patent Application Nos. 10-2011-0076208, filed on Jul. 29, 2011, and 10-2011-0128270, filed on Dec. 2, 2011, the entire contents of which are hereby incorporated by reference.

BACKGROUND OF THE INVENTION

The present invention disclosed herein relates to an apparatus, system and method for treating a substrate, and more particularly, to a substrate treating apparatus having a cluster structure, a substrate treating system, and a substrate treating method using the substrate treating system.

Semiconductor devices may be fabricated by forming circuit patterns on a substrate such as a silicon wafer through various multi-stage processes including photolithography. Such multi-stage processes are performed in corresponding chambers. Thus, an operation that a substrate is put in a chamber for performing a process, and is then put in another chamber for performing another process is repeated to fabricate a semiconductor device.

As semiconductor devices are miniaturized, processes of fabricating a semiconductor device become complicated, and the number thereof is increased. Accordingly, among a total time for fabricating a semiconductor device, a time for carrying a substrate between chambers is gradually increased.

Along with this trend, layouts of semiconductor fabrication systems for decreasing the number of unnecessary carrying processes and continuously performing processes are being actively researched in order to improve substrate throughput.

SUMMARY OF THE INVENTION

The present invention provides an apparatus, system and method for treating a substrate, which minimizes unnecessary carrying of a substrate.

However, the present invention is not limited thereto, and thus, other apparatuses, systems and methods not described herein would be clearly understood by those skilled in the art from the following descriptions and the accompanying drawings.

Embodiments of the present invention provide substrate treating apparatuses including: a load port on which a container containing a substrate is installed; a plurality of process modules treating the substrate; a transfer module disposed between the load port and the process modules, and transferring the substrate between the container and the process modules; and a buffer chamber disposed between neighboring ones of the process modules, and providing a space for carrying the substrate between the neighboring process modules.

In some embodiments, the load port, the transfer module, and the process modules may be sequentially arrayed along a second direction (Y-axis direction), and the process modules may be arrayed in a straight line at a side of the transfer module along a first direction perpendicular to the second direction in plan view.

In other embodiments, each of the process modules may include: a transfer chamber transferring the substrate between chambers disposed around the transfer chamber; a plurality of process chambers disposed around the transfer chamber to treat the substrate; and a load lock chamber disposed between the transfer module and the transfer chamber, wherein the buffer chamber is disposed between the transfer chambers of the neighboring process modules.

In still other embodiments, the buffer chamber may provide a buffer space in which the substrate carried between the neighboring process modules temporarily stays.

In even other embodiments, the buffer chamber may include: a housing; a support member disposed in the housing, and supporting the substrate; and a rotation member rotating the substrate placed on the support member.

In yet other embodiments, the buffer chamber may include: a housing; a support member disposed in the housing, and supporting the substrate; and a plasma supplier that supplies plasma to the housing.

In further embodiments, the buffer chamber may include housings that are vertically stacked.

In other embodiments of the present invention, substrate treating systems include: a plurality of substrate treating apparatuses each comprising: a load port on which a container containing a substrate is installed; a process module treating the substrate; and a transfer module disposed between the load port and the process module, and transferring the substrate between the container and the process module, and a first buffer chamber disposed between neighboring ones of the substrate treating apparatuses, and providing a space for carrying the substrate between the neighboring substrate treating apparatuses, wherein the process module comprises: a transfer chamber transferring the substrate between chambers disposed around the transfer chamber; a plurality of process chambers disposed around the transfer chamber to treat the substrate; and a load lock chamber disposed between the transfer module and the transfer chamber, and the first buffer chamber is disposed between the transfer chambers of the neighboring substrate treating apparatuses.

In some embodiments, the load port, the transfer module, and the process module may be sequentially arrayed along a second direction (Y-axis direction), and the substrate treating apparatuses may be arrayed in a straight line along a first direction perpendicular to the second direction.

In other embodiments, the first buffer chamber may provide a buffer space in which the substrate carried between the neighboring substrate treating apparatuses temporarily stays.

In still other embodiments, the first buffer chamber may include: a housing; a support member disposed in the housing, and supporting the substrate; and a rotation member rotating the substrate placed on the support member.

In even other embodiments, the first buffer chamber may include: a housing; a support member disposed in the housing, and supporting the substrate; and a plasma supplier that supplies plasma to the housing, and perform a plasma process.

In yet other embodiments, the first buffer chamber may include housings that are vertically stacked.

In further embodiments, the process module included in the substrate treating apparatus may be provided in plurality, and the substrate treating apparatus may further include a second buffer chamber that is disposed between neighboring ones of the process modules included in the same substrate treating apparatus, and that provides a space for carrying the substrate between the neighboring process modules.

In still further embodiments, the process module may include: a transfer chamber transferring the substrate between chambers disposed around the transfer chamber; a plurality of process chambers disposed around the transfer chamber to treat the substrate; and a load lock chamber disposed between the transfer module and the transfer chamber, and the second buffer chamber may be disposed between the neighboring process modules.

In still other embodiments of the present invention, substrate treating methods using a substrate treating apparatus comprising: a load port on which a container containing a substrate is installed; a transfer module taking out the substrate from the container; a plurality of process modules arrayed in a straight line at a side of the transfer module; and a buffer chamber disposed between neighboring ones of the process modules, include: carrying the substrate from the container to a first one of the process modules by the transfer module; performing a treating process by the first process module; carrying the substrate from the first process module to a first buffer chamber disposed between the first process module and a second process module neighboring the first process module; directly carrying the substrate from the first buffer chamber to the second process module; and performing a treating process by the second process module.

In some embodiments, the substrate treating methods may further include carrying the substrate from the second process module to the container by the transfer module.

In other embodiments, the substrate treating methods may further include: carrying the substrate from the second process module to a second buffer chamber disposed between the second process module and a third process module neighboring the second process module; directly carrying the substrate from the second buffer chamber to the third process module; and performing a treating process by the third process module.

In even other embodiments of the present invention, substrate treating methods using a substrate treating system comprising a plurality of substrate treating apparatuses and a buffer chamber, wherein the substrate treating apparatuses are arrayed in a straight line, each of which comprises: a load port on which a container containing a substrate is installed; a transfer module taking out the substrate from the container; and a process module disposed at a side of the transfer module, and the buffer chamber is disposed between neighboring ones of the substrate treating apparatuses, include: taking out the substrate from the container by a first one of the substrate treating apparatuses; performing a treating process by the first substrate treating apparatus; carrying the substrate from the first substrate treating apparatus to a first buffer chamber disposed between the first substrate treating apparatus and a second substrate treating apparatus neighboring the first substrate treating apparatus; directly carrying the substrate from the first buffer chamber to the second substrate treating apparatus; and performing a treating process by the second substrate treating apparatus.

In some embodiments, the substrate treating methods may further include accommodating the substrate in the container by the second substrate treating apparatus.

In other embodiments, the substrate treating methods may further include: carrying the substrate from the second substrate treating apparatus to a second buffer chamber disposed between the second process substrate treating apparatus and a third substrate treating apparatus neighboring the second substrate treating apparatus; directly carrying the substrate from the second buffer chamber to the third substrate treating apparatus; and performing a treating process by the third substrate treating apparatus.

In still other embodiments, the substrate treating methods may further include rotating the substrate by the buffer chamber.

In even other embodiments, the substrate treating methods may further include performing a process before or after the treating process by the buffer chamber.

In yet other embodiments, the process performed by the buffer chamber may include a process of removing a foreign substance formed on the substrate during the treating process.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

The terms and accompanying drawings used herein are exemplary terms and drawings for describing exemplary embodiments of the present invention, and thus, the present invention is not limited thereto.

Moreover, detailed descriptions related to well-known technologies will be ruled out in order not to unnecessarily obscure subject matters of the present invention.

Hereinafter, a substrate treating apparatus 1000 according to an embodiment of the present invention will now be described.

The substrate treating apparatus 1000 may perform a process on a substrate S. The process may be any process used to fabricate a semiconductor device, a flat panel display (FPD), and a device including a circuit on a thin film. In addition, the substrate S may be any substrate used to fabricate a semiconductor device, an FPD, and a device including a circuit on a thin film. For example, the substrate S may be a silicon wafer or one of various wafers, organic substrates, and glass substrates.

Figure 1:
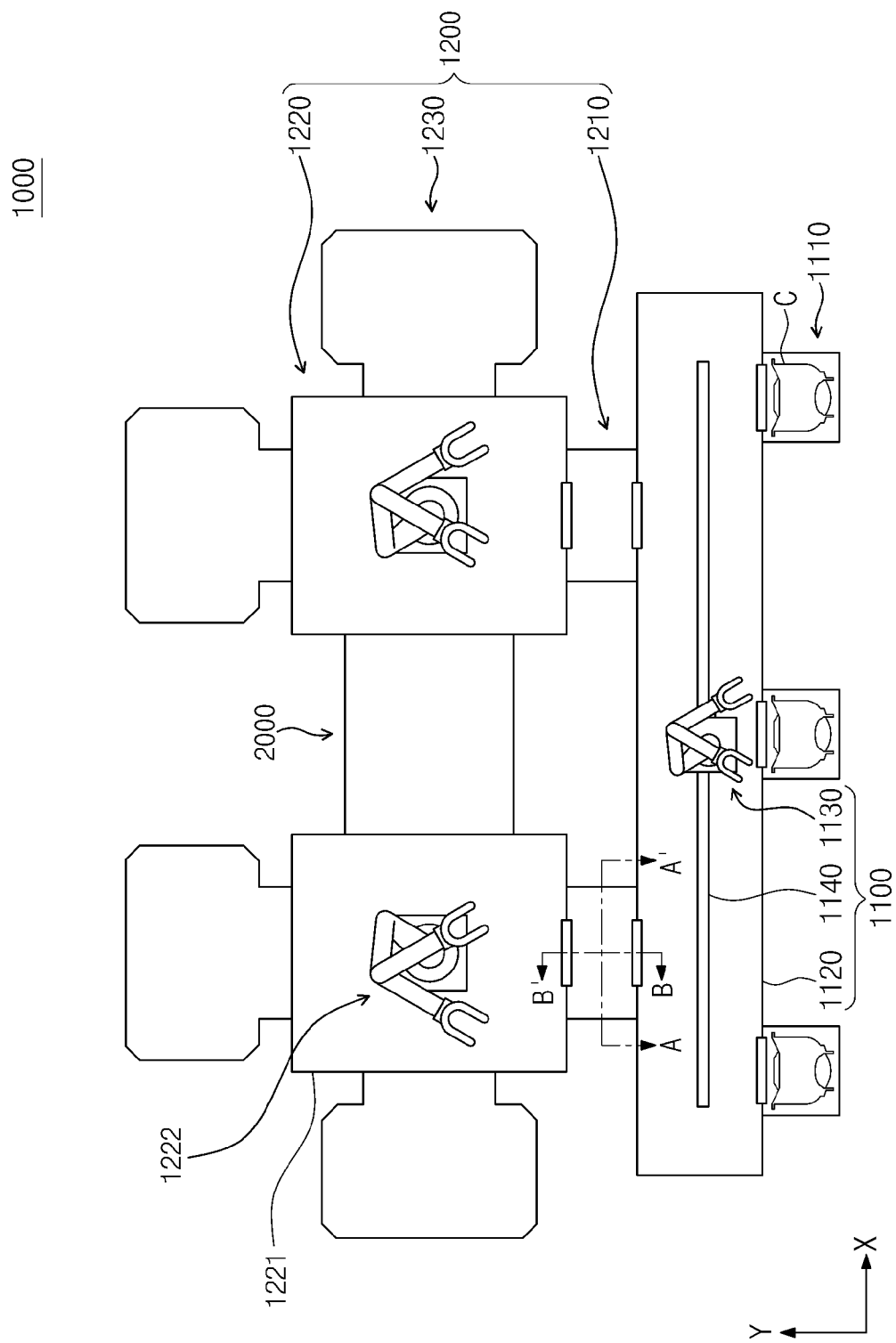
FIG. 1 is a plan view illustrating a substrate treating apparatus according to an embodiment of the present invention.

FIG. 1 is a plan view illustrating a substrate treating apparatus 1000 according to an embodiment of the present invention.

Referring to FIG. 1, the substrate treating apparatus 1000 includes a load port 1110, a transfer module 1100, a plurality of process modules 1200, and a buffer chamber 2000. A container C for containing the substrate S is placed on the load port 1110. The transfer module 1100 transfers the substrate S between the container C placed on the load port 1110 and the process modules 1200. The process modules 1200 treat the substrate S. The buffer chamber 2000 is disposed between neighboring ones of the process modules 1200 to provide a space in which the substrate S is transferred between the process modules 1200.

The container C is installed on the load port 1110. The container C may be loaded to the load port 1110 from the outside thereof, or be unloaded from the load port 1110 to the outside thereof. For example, the container C may be transferred between substrate treating apparatuses 1000 by a transfer member such as an overhead transfer. Instead of the overhead transfer, the substrate S may be transferred by an automatic guided vehicle, a rail guided vehicle, or a worker.

A front opening unified pod (FOUP) may be used as the container C for containing the substrate S. Generally, the front opening unified pod can accommodate twenty five substrates S. The container C may be closed to prevent the substrate S from being contaminated.

The load port 1110 may be adjacent to the transfer module 1100. For example, as illustrated in FIG. 1, three load ports 1110 may be arrayed in a straight line along a first direction X at a side of a housing 1120 of the transfer module 1100. The number and arrangement of load ports 1110 are not specifically limited.

The transfer module 1100 transfers the substrate S between the container C and the process modules 1200. The transfer module 1100 is disposed between the load ports 1110 and the process modules 1200 to transfer the substrate S. The transfer module 1100 may include the housing 1120, a transfer robot 1130, and a transfer rail 1140.

The housing 1120 constitutes an outer wall of the transfer module 1100, and isolates an inner space of the transfer module 1100 from the outside thereof. The housing 1120 may have a rectangular parallelepiped shape. However, the shape of the housing 1120 is not limited thereto.

The housing 1120 is disposed between the load ports 1110 and the process modules 1200. Accordingly, a side of the housing 1120 is connected to the load ports 1110, and another side thereof is connected to the process modules 1200.

The side of the housing 1120 connected to the load ports 1110 has an opening for exchanging the substrate S with the containers C installed on the load ports 1110, and a door for opening and closing the opening is provided thereon. The side of the housing 1120 connected to the process modules 1200 is connected to load lock chambers 1210 of the process modules 1200.

A fan filter (not shown) may be installed on an upper surface of the housing 1120 to purify air introduced into the housing 1120. Accordingly, the air purified within the housing 1120 flows from the upper side to the lower side to maintain a clean atmosphere in the housing 1120.

The transfer robot 1130 directly holds the substrate S, and transfers the substrate S between the container C and the process modules 1200. The transfer robot 1130 may exchange the substrate S with the container C through the first side of the housing 1120, and change the substrate S with the process modules 1200 through the load lock chambers 1210 connected to the second side of the housing 1120.

The transfer robot 1130 may be disposed within the housing 1120, and move along the transfer rail 1140. The transfer rail 1140 may function as a moving path of the transfer robot 1130. The transfer rail 1140 may extend along the first direction X within the housing 1120. However, the configuration of the transfer rail 1140 is not limited thereto, and thus, the transfer rail 1140 may extend along a direction different from the first direction X. Alternatively, the transfer rail 1140 may be removed, and the transfer robot 1130 may be fixed to an inner central portion of the housing 1120.

The transfer robot 1130 may include a base, a body, an arm, and a hand. The base may be installed on the transfer rail 1140, and may move along the transfer rail 1140. The body may be connected to the base, and vertically move on the base, or rotate about a vertical axis. The arm may be installed on the body, and move back and forth. The hand may be disposed at an end of the arm to hold or release the substrate S. The arm may be provided in plurality. In this case, the arms may be vertically stacked on the body, and be individually operated.

The transfer robot 1130 may move the base along the transfer rail 1140, and control the position of the hand according to motions of the body and the arm. In addition, the transfer robot 1130 may control the hand to take out the substrate S from the container C and put the substrate S in the process module 1200, or to take out the substrate S from the process module 1200 and put the substrate S in the container C. The container C in a closed state may be loaded to the load port 1110, and a container opener may be disposed in the housing 1120 to open and close the container C. When the container opener opens the container C, the transfer robot 1130 may hold the substrate S accommodated in the container C.

The process modules 1200 treat the substrate S. The process modules 1200 may be arrayed in a straight line along the first direction X at a second side of the transfer modules 1100.

Although the number of the process modules 1200 illustrated in FIG. 1 is two, the number of process modules 1200 is not limited thereto.

Figure 2:
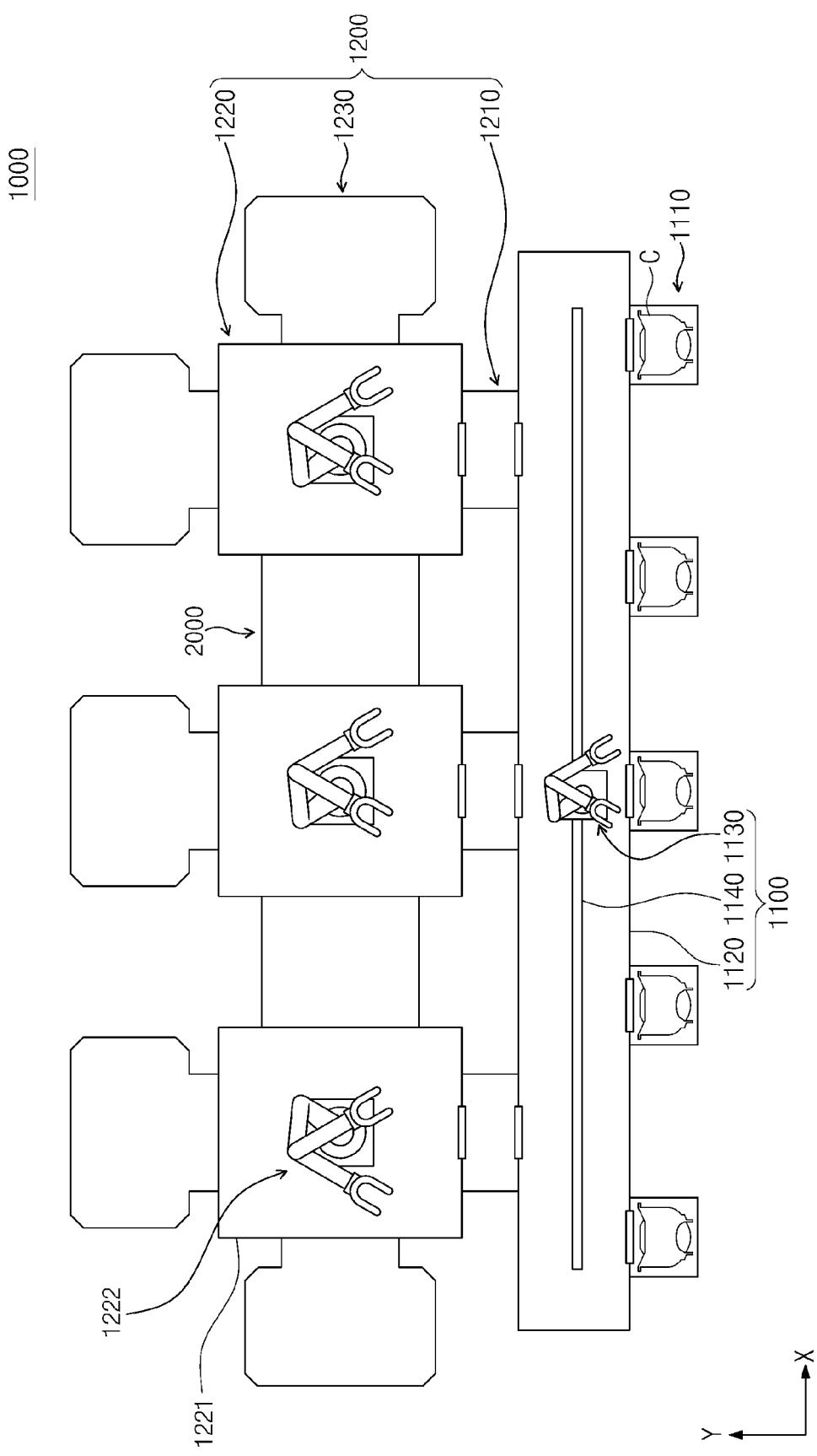
FIG. 2 is a plan view illustrating a substrate treating apparatus according to another embodiment of the present invention.

FIG. 2 is a plan view illustrating a substrate treating apparatus 1000 according to another embodiment of the present invention. Referring to FIG. 2, the substrate treating apparatus 1000 may include at least three process modules 1200.

Each of the process modules 1200 includes a load lock chamber 1210, a transfer chamber 1220, and a process chamber 1230. Load ports 1110, a transfer module 1100, the load lock chambers 1210, and the transfer chambers 1220 may be sequentially arrayed along a second direction Y perpendicular to a first direction X. The load lock chambers 1210 are disposed at a second side of the transfer module 1100, and provide spaces for exchanging the substrate S between the transfer module 1100 and the process modules 1200. The transfer chambers 1220 transfer the substrate S between chambers disposed around the transfer chambers 1220. The process chambers 1230 are disposed around the transfer chambers 1220 to perform processes.

The load lock chambers 121 are disposed between the transfer module 1100 and the transfer chambers 1220, and provide spaces for exchanging the substrate S between the transfer module 1100 and the transfer chambers 1220. The load lock chambers 1210 of the process modules 1200 may be arrayed in a straight line along the first direction X at the second side of the transfer module 1100. One process module 1200 may include a plurality of load lock chambers 1210 stacked vertically.

Figure 3:
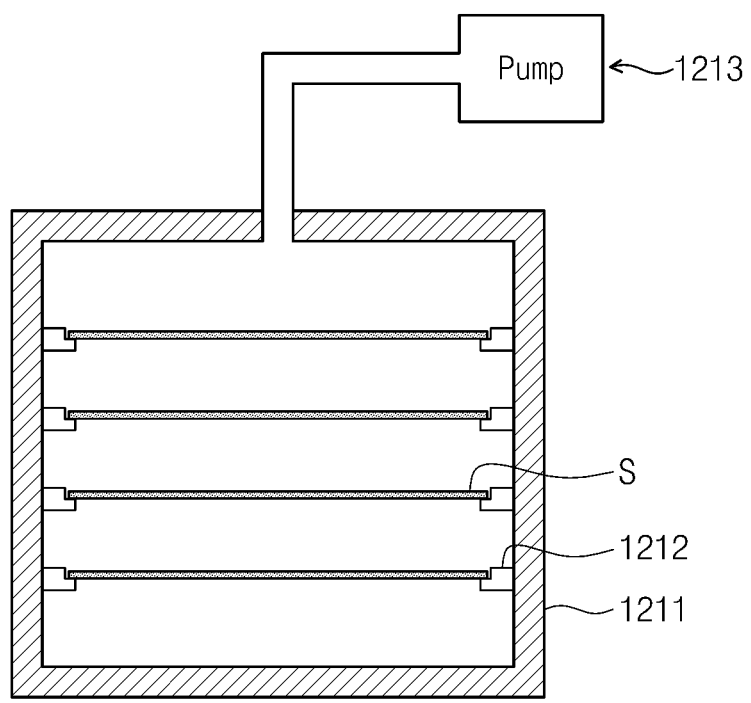
FIG. 3 is a cross-sectional view taken along line A-A' of FIG. 1.
Figure 4:
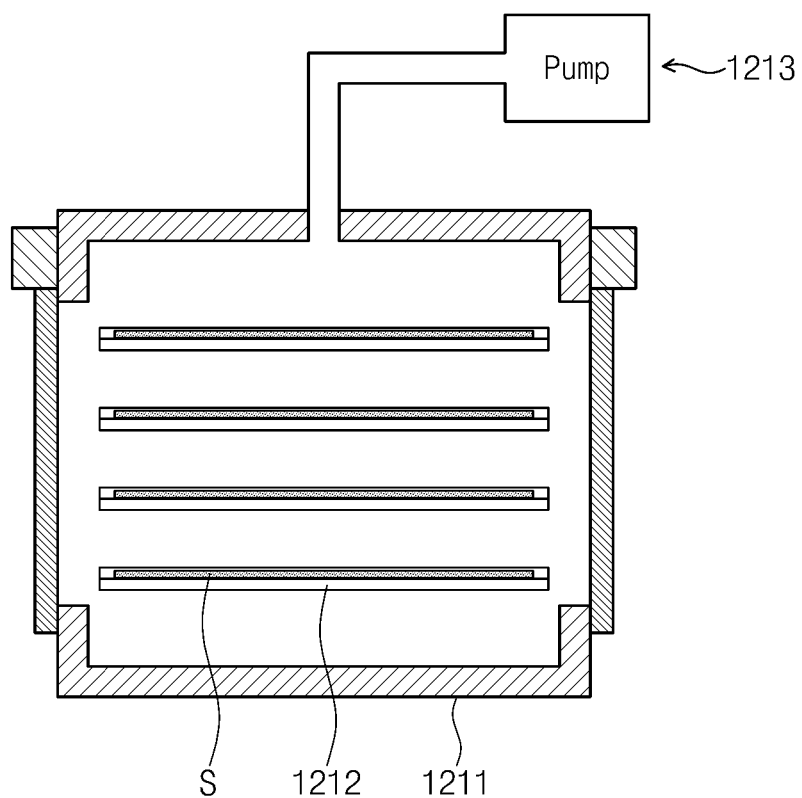
FIG. 4 is a cross-sectional view taken along line B-B' of FIG. 1.

FIG. 3 is a cross-sectional view taken along line A-A' of FIG. 1. FIG. 4 is a cross-sectional view taken along line B-B' of FIG. 1.

Referring to FIGS. 3 and 4, the load lock chamber 1210 may include a housing 1211, a plurality of support slots 1212, and a depressurizing member 1213.

The housing 1211 constitutes an outer wall of the load lock chamber 1210, and isolates an inner space of the load lock chamber 1210 from the outside thereof. The substrate S that is exchanged between the transfer module 1100 and the transfer chamber 1220 may temporarily stay in the housing 1211.

A side of the housing 1211 is connected to the second side of the transfer module 1100, and another side thereof is connected to the transfer chamber 1220. The first and second sides of the housing 1211 are provided with openings, respectively, through which the substrate S is transferred, and doors for opening and closing the openings are provided thereon.

The support slots 1212 are disposed on an inner wall of the housing 1211. Each of the support slots 1212 may have a pair of plate shapes spaced apart from each other to support the edge of the substrate S. The transfer robot 1130 of the transfer module 1100 or a carrier robot 1222 of the transfer chamber 1220 may vertically move along the space between both the plate shapes to place the substrate S on the support slot 1212 or pick up the substrate S from the support slot 1212.

The load lock chamber 1210 may include at least one of the support slots 1212. The support slots 1212 may be vertically spaced apart from one another on the inner wall of the housing 1211.

The depressurizing member 1213 may depressurize an inner space of the housing 1211. The depressurizing member 1213 may include a depressurizing pump and a pump line. The depressurizing pump generates negative pressure by using external power, and the pump line connects the depressurizing pump to the housing 1211, so that air can be suctioned from the housing 1211 by means of the negative pressure generated by the depressurizing pump.

Inner pressure of the transfer module 1100 may be atmospheric pressure, and inner pressure of chambers of the process modules 1200 may be maintained below the atmospheric pressure, e.g., at vacuum pressure in order to form conditions appropriate to perform processes. The load lock chamber 1210 may be disposed between the transfer module 1100 and a chamber of the process module 1200 to prevent air from being introduced into the process module 1200 when the substrate S is transferred.

When the substrate S is transferred from the transfer module 1100 to the load lock chamber 1210, the load lock chamber 1210 closes the housing 1211 and forms a vacuum in the housing 1211 by using the depressurizing member 1213. Then, the load lock chamber 1210 opens the second side of the housing 1211 to transfer the substrate S to the transfer chamber 1220. Accordingly, inner pressure of the process module 1200 can be maintained at the vacuum pressure.

The transfer chambers 1220 transfer the substrate S between chambers disposed around the transfer chambers 1220. The load lock chamber 1210, the process chamber 1230, and the buffer chamber 2000 may be disposed around the transfer chamber 1220. Particularly, the load lock chamber 1210 may be disposed between the transfer chamber 1220 and the transfer module 1100, and the buffer chamber 2000 may be disposed between the transfer chambers 1220 of the process modules 1200, and the process chamber 1230 may be disposed in the other portion of the periphery of the transfer chamber 1220.

The transfer chamber 1220 includes a housing 1221 and the carrier robot 1222.

The housing 1221 constitutes an outer wall of the transfer chamber 1220. The chambers 1210, 1230, and 2000 disposed around the transfer chamber 1220 are connected to the housing 1221.

The carrier robot 1222 is fixed to a central portion of the housing 1221, and carries the substrate S between the chambers 1210, 1230, and 2000 around the transfer chamber 1220.

The carrier robot 1222 includes a base, a body, an arm, and a hand, and is similar to the transfer robot 1130 in terms of configuration, except that the base is fixed to a central portion of the transfer chamber 1220.

The process chambers 1230 perform processes. Examples of the processes performed by the process chambers 1230 include an etching process, a peeling process, an ashing process, a strip process, and a deposition process. However, the processes performed by the process chambers 1230 are not limited thereto.

Each of the process modules 1200 may include at least one of the process chambers 1230.

The process chambers 1230 are disposed around the transfer chamber 1220 to receive the substrate S carried by the carrier robot 1222. The process chambers 1230 included in the same process module 1200 may perform the same process. The process chambers 1230 included in the different process modules 1200 may perform different processes. However, the process chambers 1230 included in the same process module 1200 may perform different processes, and the process chambers 1230 included in the different process modules 1200 may perform the same process.

The process chambers 1230 may include well-known configurations corresponding to processes to be performed.

The buffer chamber 2000 is disposed between neighboring ones of the process modules 1200. Particularly, the transfer chamber 1220 of one of the process modules 1200, the buffer chamber 2000, and the transfer chamber 1220 of another one of the process modules 1200 may be sequentially arrayed along the first direction X. According to this arrangement, the buffer chamber 2000 provides a space for carrying the substrate S between the process modules 1200. That is, after being treated in one of the process modules 1200, the substrate S may be carried to another one of the process modules 1200 through the buffer chamber 2000. Unless the buffer chamber 2000 is provided, the substrate S is carried from one of the process modules 1200 to another one through the transfer module 1100. Thus, when the buffer chamber 2000 is provided, the carrying of the substrate S through the transfer module 1100 is unnecessary.

The buffer chamber 2000 may function just as a passage for carrying the substrate S, or may function as an apparatus device for performing a process on the substrate S as well as a passage.

Figure 5:
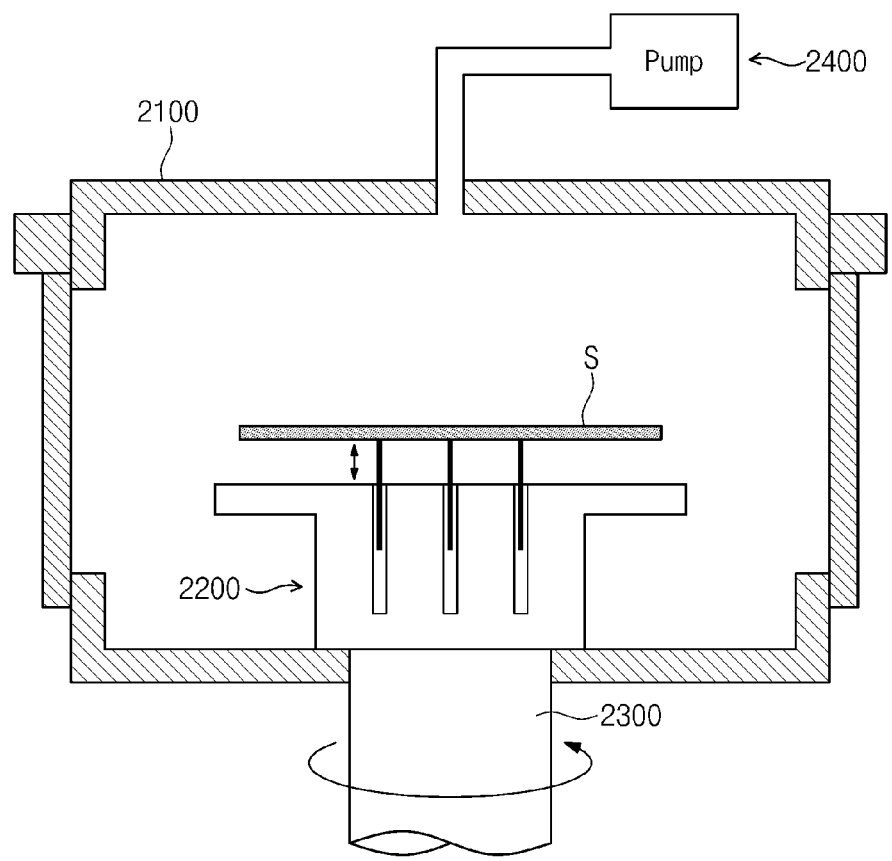
FIG. 5 is a cross-sectional view illustrating a buffer chamber of FIG. 1, according to another embodiment of the present invention.

FIG. 5 is a cross-sectional view illustrating the buffer chamber 2000 of FIG. 1, according to another embodiment of the present invention.

Referring to FIG. 5, the buffer chamber 2000 may function just as a passage for carrying the substrate S.

The buffer chamber 2000 includes a housing 2100 and a support member 2200. Selectively, the buffer chamber 2000 may include a rotation member 2300 and a depressurizing member 2400.

The housing 2100 constitutes an outer wall of the buffer chamber 2000, and is disposed between the housings 1221 of the transfer chambers 1220 of neighboring process modules 1200. Both sides of the housing 2100 are provided with openings, respectively, through which the substrate S is transferred, and doors for opening and closing the openings are provided thereon.

The support member 2200 supports the substrate S. The support member 2200 is disposed in a central portion of the housing 2100. The top surface of the support member 2200 may have a shape similar to that of the substrate S, and be equal to or greater than an area of the substrate S. The support member 2200 may include lift pines to vertically move the substrate S, so that the carrier robot 1222 can efficiently hold the substrate S. Alternatively, the support member 2200 may have a configuration similar to that of the support slot 1212 of the load lock chamber 1210.

The rotation member 2300 rotates the substrate S placed on the support member 2200. When the substrates S are exchanged between the process modules 1200, it is needed to align orientations of the substrates S. To this end, the rotation member 2300 may rotate the substrate S. The rotation member 2300 may include a rotation motor and a rotation shaft. The rotation motor may generate torque. The rotation shaft is connected to the rotation motor and the support member 2200 to rotate the support member 2200 according to torque generated from the rotation motor, thereby rotating the substrate S placed on the support member 2200.

The depressurizing member 2400 may depressurize an inner space of the housing 2100. Since inner pressure of the process modules 1200 may be set differently, the depressurizing member 2400 can prevent air from being introduced from the process module 1200 having high inner pressure to the process module 1200 having lower inner pressure, by depressurizing the inner space of the housing 2100. Since the configuration of the depressurizing member 2400 may be similar to that of the depressurizing member 1213 of the load lock chamber 1210, a description thereof will be omitted.

When the process modules 1200 have the same inner pressure, the depressurizing member 2400 may be removed from the buffer chamber 2000. In this case, the closing of the housing 2100 is unnecessary, and thus, the doors for opening and closing the openings may be unnecessary.

Figure 6:
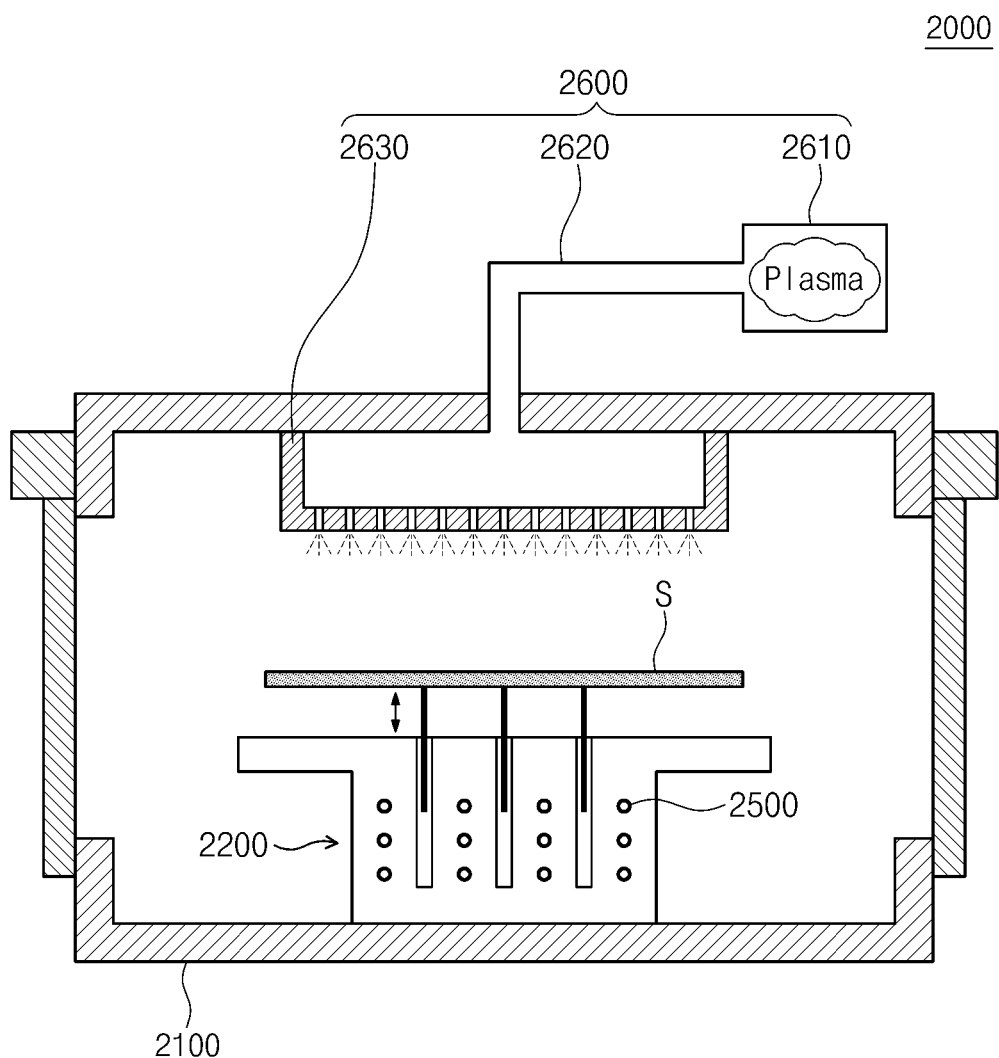
FIG. 6 is a cross-sectional view illustrating the buffer chamber of FIG. 1, according to another embodiment of the present invention.

FIG. 6 is a cross-sectional view illustrating the buffer chamber 2000 of FIG. 1, according to another embodiment of the present invention.

The buffer chamber 2000 may function not only as a passage between the process modules 1200, but also as an apparatus device for performing a process on the substrate S. The process performed by the buffer chamber 2000 may be followed by a process performed by the process chamber 1230, or follow the process. Hereinafter, a cleaning process, particularly, a cleaning process using plasma will be exemplified as the process performed by the buffer chamber 2000. However, the process performed by the buffer chamber 2000 is not limited thereto. As such, when the buffer chamber 2000 performs a process, a process chamber 1230, would otherwise perform the process performed by the buffer chamber 2000, can be replaced with another process chamber 1230 performing another process, whereby a space can be more efficiently used in the same foot print.

Referring to FIG. 6, the buffer chamber 2000 may include a housing 2100, a support member 2200, a heating member 2500, and a plasma supplier 2600.

A description of the housing 2100 and the support member 2200 is referred to in the description of the buffer chamber 2000 of the previous embodiment.

The heating member 2500 may heat the substrate S placed on the support member 2200. For example, the heating member 2500 may be a heater embedded in an outer wall of the housing 2100 or the support member 2200, or a high pressure gas line disposed at a side of the housing 2100 to supply high pressure gas to the housing 2100. When the substrate S is heated by the heating member 2500, a foreign substance remaining on the substrate S can be removed therefrom. The foreign substance may be formed in a previous process of the process chamber 1230.

The plasma supplier 2600 may supply plasma into the housing 2100.

The buffer chamber 2000 may perform a plasma process by using the supplied plasma. For example, the buffer chamber 2000 may perform a plasma ashing process or a plasma cleaning process. Alternatively, the buffer chamber 2000 may perform a process different from the plasma ashing process and the plasma cleaning process. In this case, the plasma supplier 2600 may be replaced with a device corresponding to the different process. For example, when the different process uses a chemical or gas, the plasma supplier 2600 may be replaced with a chemical supplier or a gas supplier.

The plasma supplier 2600 may include a plasma source 2610, a supply pipe 2620, and a shower head 2630.

The plasma source 2610 generates plasma. For example, the plasma source 2610 may be a remote plasma generator, a capacitively coupled plasma generator (OCP), or an inductively coupled plasma generator (ICP).

The remote plasma generator may be disposed outside the housing 2100, and generate plasma by using gas supplied from a gas supplying source (not shown). The supply pipe 2620 supplies the generated plasma into the housing 2100. The shower head 2630 may be installed at an end of the supply pipe 2620. Plasma supplied through the supply pipe 2620 may be injected into the housing 2100 through the shower head 2630.

When the capacitively coupled plasma generator or the inductively coupled plasma generator is used, the plasma source 2610 may be disposed within the housing 2100 or on the outer wall of the housing 2100. In this case, the supply pipe 2620 may supply gas from an external gas supplying source (not shown) into the housing 2100, and the plasma source 2610 may generate plasma by using the supplied gas.

Figure 7:
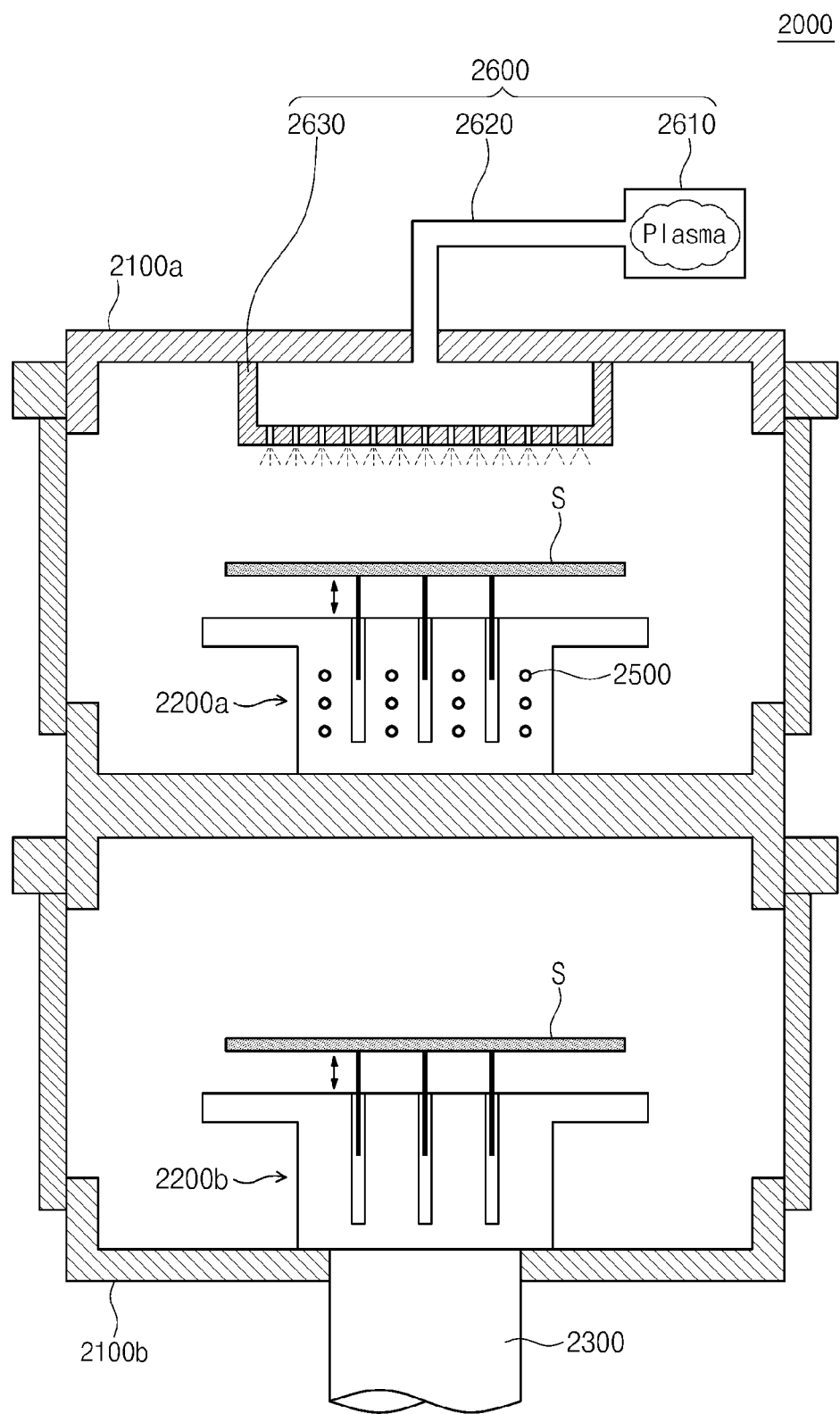
FIG. 7 is a cross-sectional view illustrating the buffer chamber of FIG. 1, according to another embodiment of the present invention.

FIG. 7 is a cross-sectional view illustrating the buffer chamber 2000 of FIG. 1, according to another embodiment of the present invention.

In the previous embodiments, a single housing is used as the housing 2100 of the buffer chamber 2000. However, the buffer chamber 2000 may include a plurality of housings in a stacked structure. In this case, the number of the buffer chambers 2000 per unit foot print can be increased, and thus, a space can be used more efficiently.

Referring to FIG. 7, the buffer chamber 2000 may include a plurality of housings 2100.

Each of the housings 2100 may be the housing 2100 of FIG. 5 or 6.

For example, the buffer chambers 2000 may include an upper housing 2100a and a lower housing 2100b, which are vertically stacked. The lower housing 2100b may include only both a support member 2200b and a rotation member 2300 just to provide a passage for transferring the substrate S between the process modules 1200, or to align the substrates S. The upper housing 2100a may include a support member 2200a, a heating member 2500, and a plasma supplier 260, to not only provide a passage but also perform a process.

Alternatively, both the upper housing 2100a and the lower housing 2100b may function as only passages, or function as passages and processing devices. Furthermore, three housings 2100 may be stacked.

Hereinafter, a substrate treating system 100 according to another embodiment of the present invention will be described.

The substrate treating system 100 may include a plurality of substrate treating apparatuses 1000 and a plurality of buffer chambers 2000. The substrate treating apparatuses 1000 may perform different processes.

Figure 8:
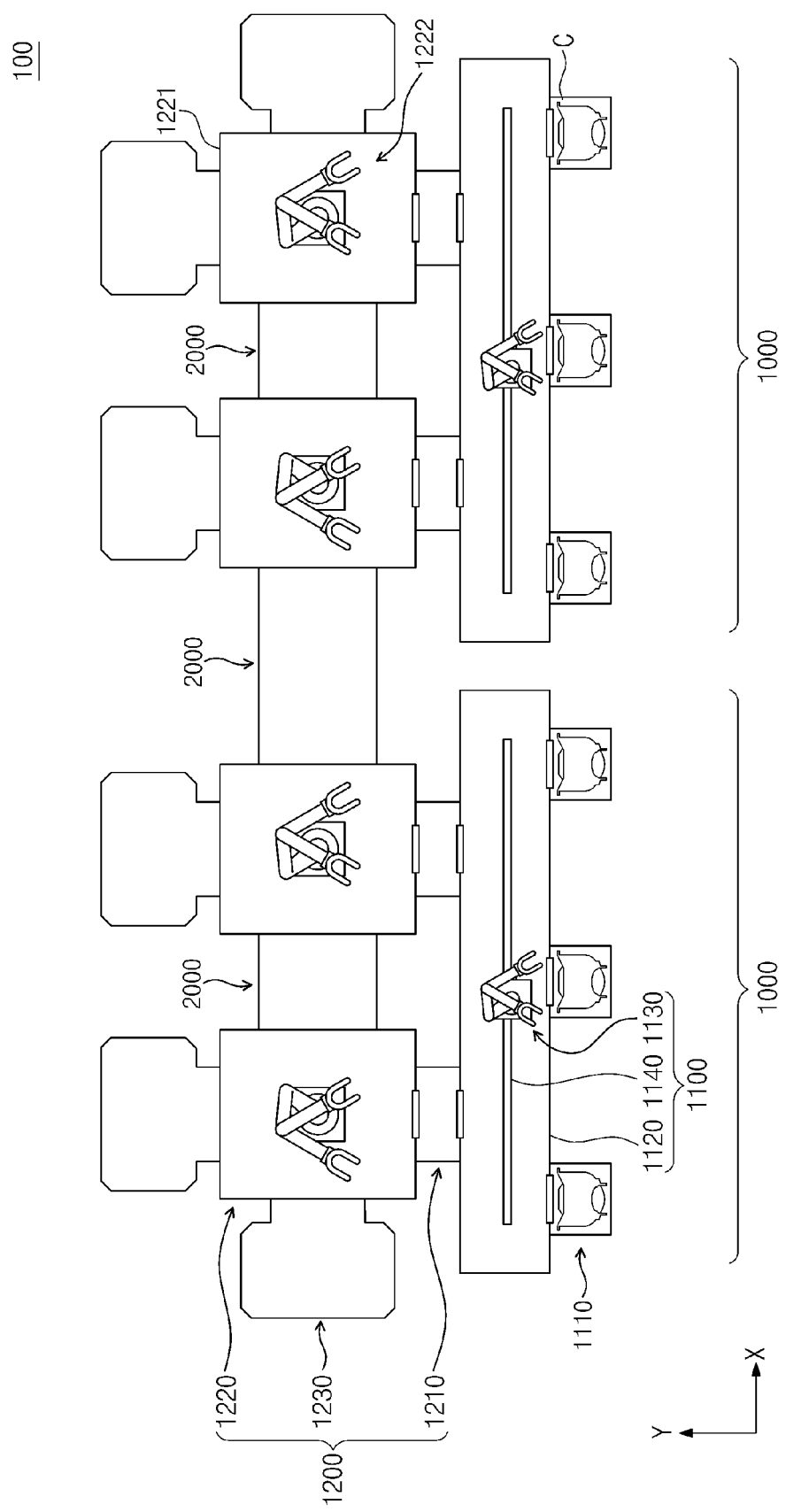
FIG. 8 is a plan view illustrating a substrate treating system according to another embodiment of the present invention.

FIG. 8 is a plan view illustrating a substrate treating system 100 according to another embodiment of the present invention.

Referring to FIG. 8, the substrate treating system 100 includes: a plurality of substrate treating apparatuses 1000 arrayed along a first direction X; and a plurality of buffer chambers 2000 each disposed between neighboring ones of the substrate treating apparatuses 1000. Accordingly, one of the substrate treating apparatuses 1000, the buffer chamber 2000, and another one of the substrate treating apparatus 1000 are sequentially arrayed along the first direction X.

Each of the substrate treating apparatuses 1000 includes a load port 1110, a transfer module 1100, and a plurality of process modules 1200, which are arrayed along a second direction Y. A transfer chamber 1220 of one of the process modules 1200, the buffer chamber 2000, and a transfer chamber 1220 of another one of the process modules 1200 are arrayed along the first direction X. Since the substrate treating apparatus 1000 is described in the previous embodiments, the description thereof will be omitted in the current embodiment.

The configuration of the buffer chamber 2000 disposed between the substrate treating apparatuses 1000 may be the same as or similar to that of the buffer chamber 2000 disposed between the process modules 1200.

The buffer chamber 2000 disposed between the substrate treating apparatuses 1000 provides a space for carrying the substrate S between the substrate treating apparatuses 1000, instead of providing a space for carrying the substrate S between the process modules 1200. Particularly, the buffer chamber 2000 between the substrate treating apparatuses 1000 is disposed between the transfer chambers 1220 of the substrate treating apparatuses 1000. Thus, both sides of the buffer chamber 2000 between the substrate treating apparatuses 1000 are connected to the transfer chambers 1220 of the substrate treating apparatuses 1000.

Although the number of the substrate treating apparatuses 1000 illustrated in FIGS. 8 is two, the number of substrate treating apparatuses 1000 included in the substrate treating system 100 is not limited thereto. Furthermore, the configuration of the substrate treating apparatuses 1000 included in the substrate treating system 100 may be different from the above described configuration.

Figure 9:
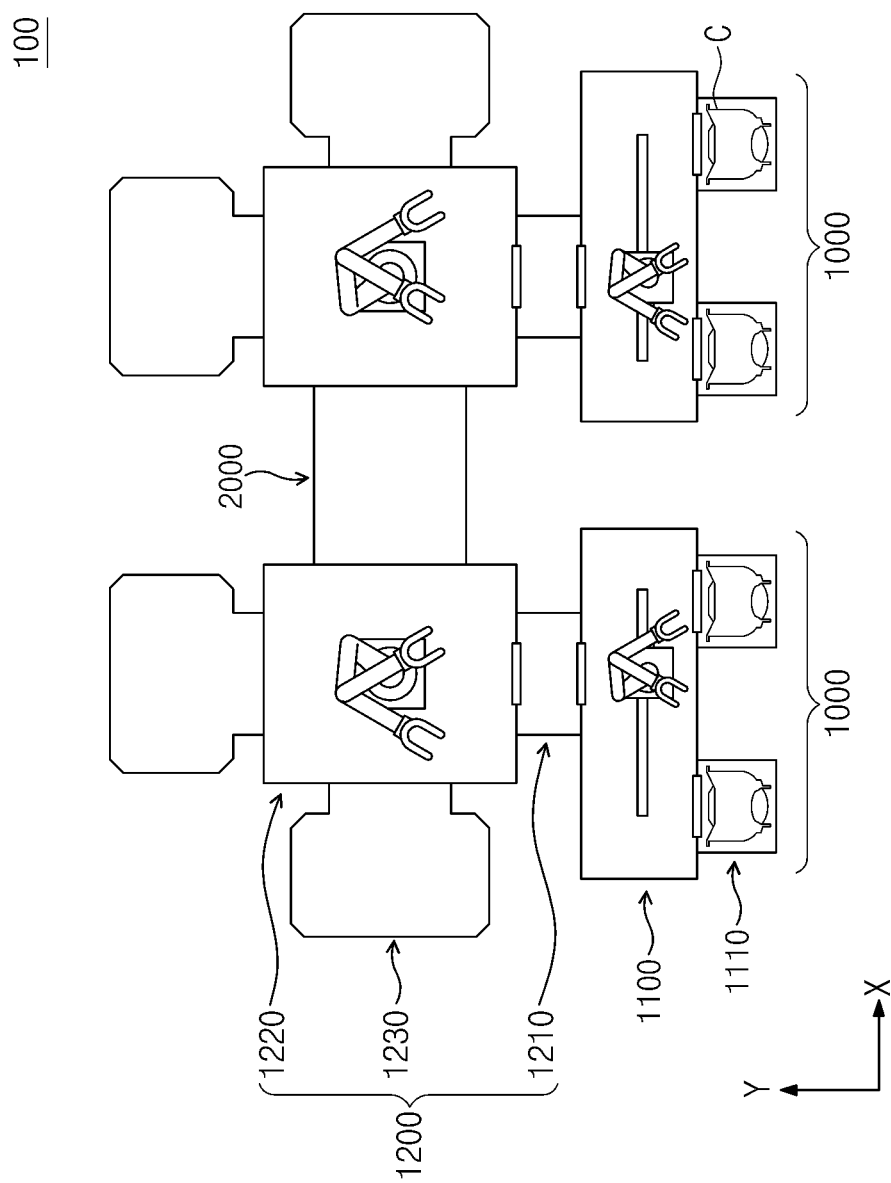
FIG. 9 is a plan view illustrating a substrate treating system according to another embodiment of the present invention.

FIG. 9 is a plan view illustrating a substrate treating system 100 according to another embodiment of the present invention.

A substrate treating apparatus 1000 included in a substrate treating system 100 is not limited to the configuration including a plurality of process modules 1200 and a buffer chamber 2000 therebetween, that is, not limited to the substrate treating apparatus 1000 of FIG. 8.

Referring to FIG. 9, each of substrate treating apparatuses 1000 included in the substrate treating system 100 according to the current embodiment includes a load port 1110, a transfer module 1100, and a process module 1200. Thus, a buffer chamber 2000 disposed between process modules 1200 may be unnecessary.

Figure 10:
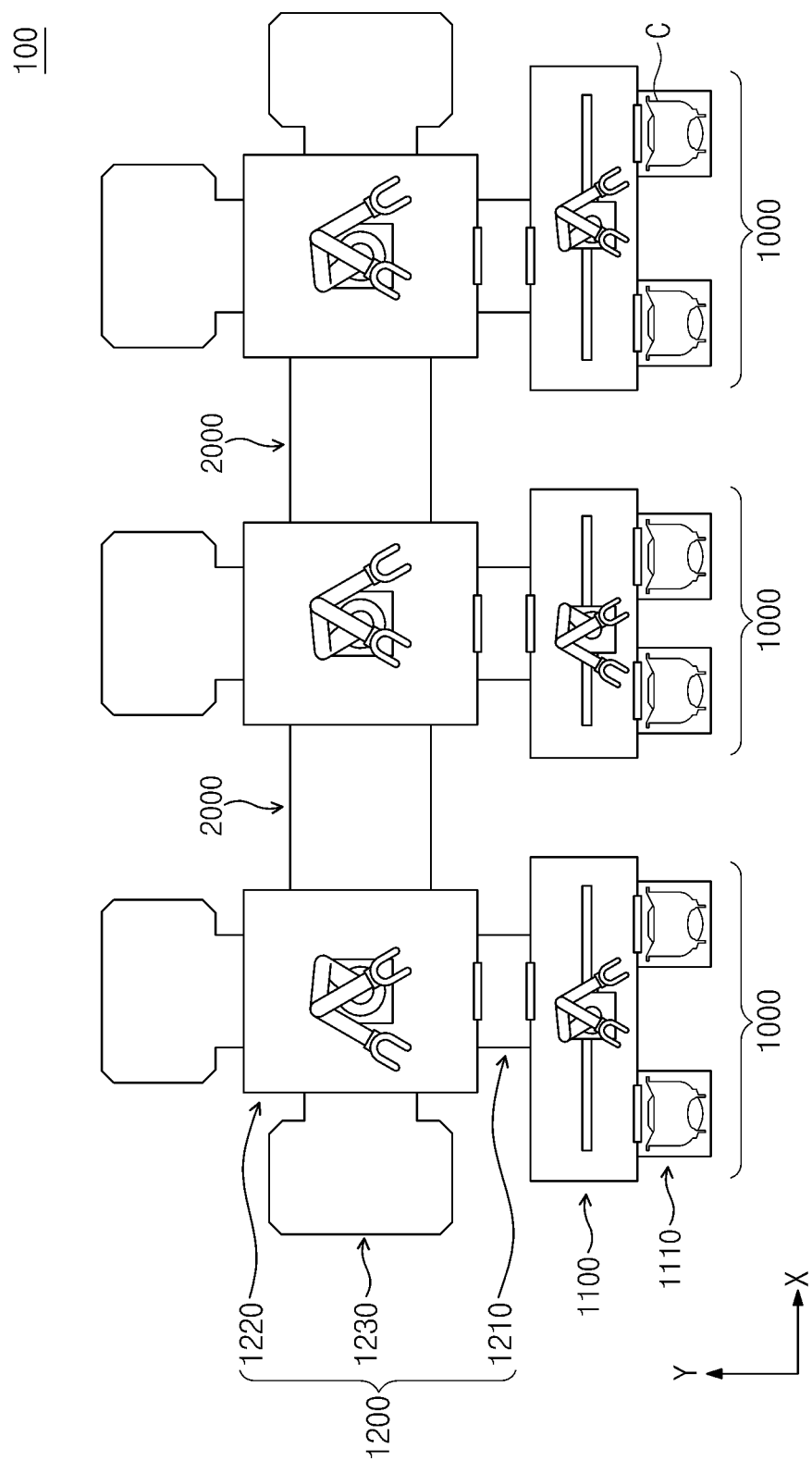
FIG. 10 is a plan view illustrating a substrate treating system according to another embodiment of the present invention.

FIG. 10 is a plan view illustrating a substrate treating system 100 according to another embodiment of the present invention. Referring to FIG. 10, the substrate treating system 100 may include at least three substrate treating apparatuses 1000.

Hereinafter, a substrate treating method according to another embodiment of the present invention will be described with respect to the substrate treating apparatuses 1000 and the substrate treating systems 100 as described above.

This is just for convenience in description, and thus, substrate treating methods according to the present invention are not limited by the substrate treating apparatuses 1000 and the substrate treating systems 100. Hence, substrate treating methods according to the present invention may be performed by any various apparatuses similar or identical to the substrate treating apparatuses 1000 and the substrate treating systems 100.

Hereinafter, a substrate treating method will now be described according to another embodiment of the present invention. The substrate treating method is a method of treating a substrate S in a substrate treating apparatus 1000.

Figure 11:
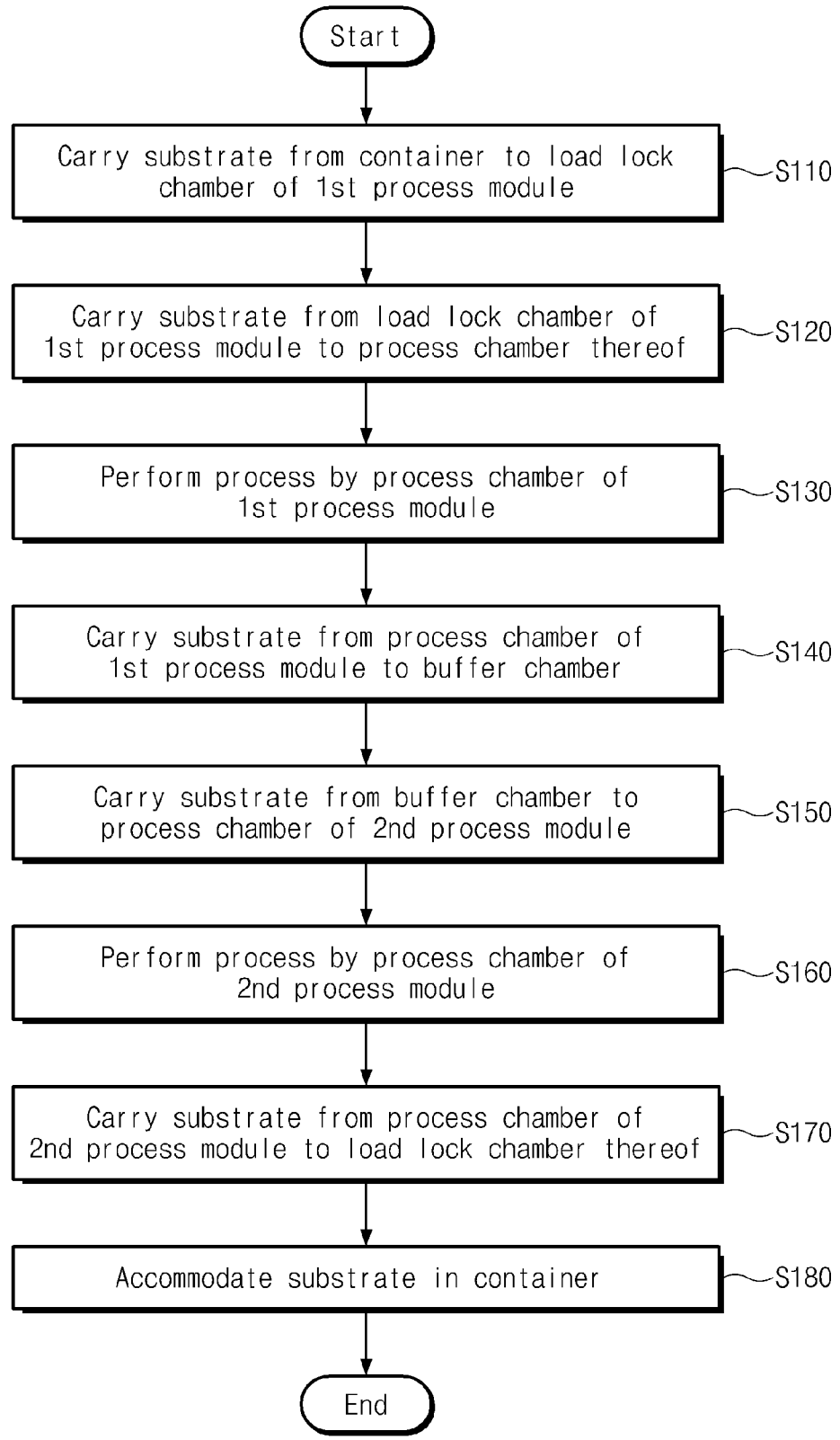
FIG. 11 is a flowchart illustrating a substrate treating method according to another embodiment of the present invention.

FIG. 11 is a flowchart illustrating the substrate treating method according to the current embodiment.

Referring to FIG. 11, the substrate treating method may include: an operation S110 of carrying a substrate S from a container C to a load lock chamber 1210a of a first process module 1200a; an operation S120 of carrying the substrate S from the load lock chamber 1210a to a process chamber 1230a of the first process module 1200a; an operation S130 of performing a process by the process chamber 1230a; an operation S140 of carrying the substrate S from the process chamber 1230a to a buffer chamber 2000; an operation S150 of carrying the substrate S from the buffer chamber 2000 to a process chamber 1230b of a second process module 1200b; an operation S160 of performing a process by the process chamber 1230b; an operation S170 of carrying the substrate S from the process chamber 1230b to a load lock chamber 1210b of the second process module 1200b; and an operation S180 of accommodating the substrate S in another container C. The order of the above described processes is not limited to the order of describing them, and thus, a subsequently described process may be followed by a previously described process, which is applied in a same manner to other substrate treating methods to be described later according to other embodiments. Hereinafter, the above described processes will now be described in detail.

Figure 12:
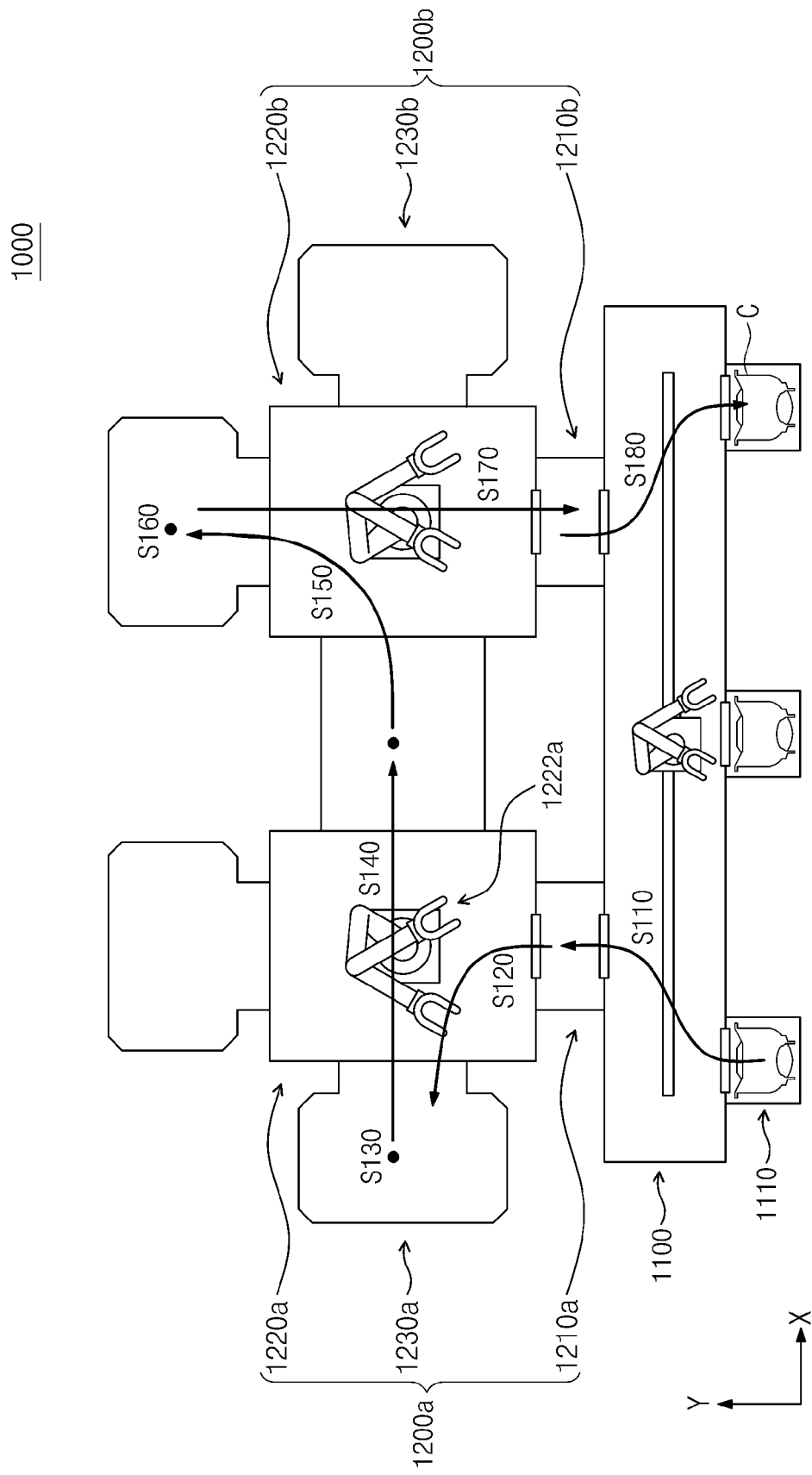
FIGS. 12 and 13 are plan views illustrating processes of the substrate treating method of FIG. 11.
Figure 13:
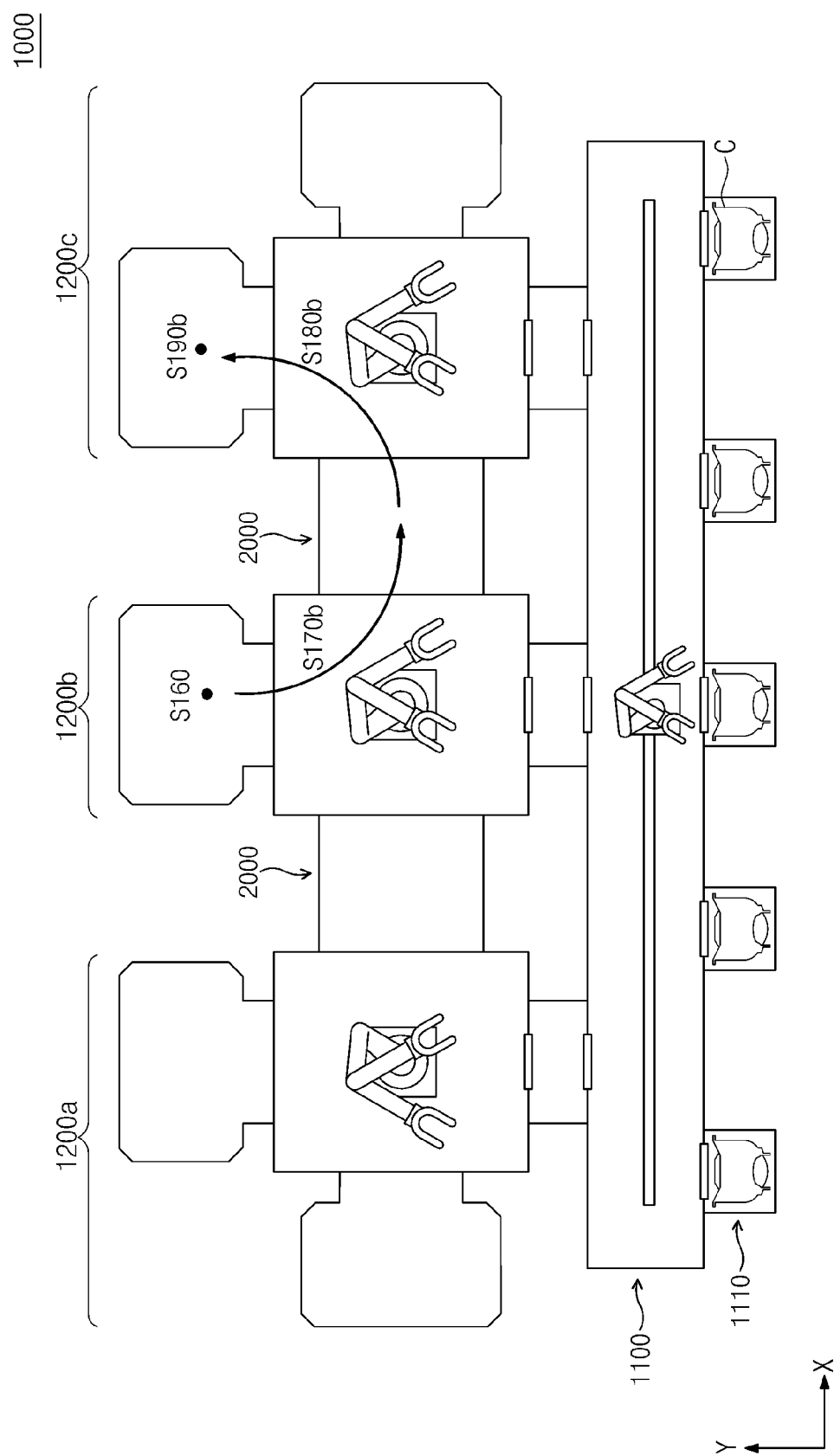

FIGS. 12 and 13 are plan views illustrating the processes of the substrate treating method of FIG. 11.

Referring to FIG. 12, in the operation S110, the transfer module 1100 carries the substrate S from the container C to the load lock chamber 1210a of the first process module 1200a. When a container opener opens the container C, the transfer robot 1130 takes out the substrate S from the container C.

A door of the load lock chamber 1210a opens an opening connected to the transfer module 1100, and the transfer robot 1130 places the substrate S on the support slot 1212. When the substrate S is put in the load lock chamber 1210a, a housing 1211 is closed, and a depressurizing member 1213 form a vacuum in the housing 1211. Then, an opening of the load lock chamber 1210a connected to a transfer chamber 1220a is opened.

In the operation S120, the transfer chamber 1220a carries the substrate S from the load lock chamber 1210a to the process chamber 1230a. When the opening of the load lock chamber 1210a is opened, a carrier robot 1222a takes out the substrate S from the load lock chamber 1210a, and puts the substrate S in the process chamber 1230a.

Then, the process chamber 1230*a* performs the process in the operation S130.

When the process is ended, the transfer chamber 1220*a* carries the substrate S from the process chamber 1230*a* to the buffer chamber 2000 in the operation S140. The carrier robot 1222*a* takes out the substrate S from the process chamber 1230*a*, and places the substrate S on a support member 2200 when a door of the buffer chamber 2000 is opened.

Then, the buffer chamber 2000 may align the substrate S in an operation S141, or perform a process in an operation S142. For example, a rotation member 2300 may rotate the substrate S by rotating the support member 2200. For another example, when the substrate S is placed on the support member 2200, a plasma supplier 2600 may supply plasma to a housing 2100 to perform a plasma process. At this point, a heating member 2500 may heat the substrate S. The plasma process may remove a foreign substance formed on the substrate S in the process chamber 1230*a*.

When the buffer chamber 2000 functions just as a passage, the operations S141 or S142 may be removed. Alternatively, the buffer chamber 2000 may perform both the operations S141 and S142. The buffer chamber 2000 may perform a process different from the plasma process.

In the operation S150, a transfer chamber 1220*b* of the second process module 1200*b* carries the substrate S from the buffer chamber 2000 to the process chamber 1230*b*.

The transfer chamber 1220*b* may take out the substrate S from the buffer chamber 2000, and put the substrate S in the process chamber 1230*b*. The second process module 1200*b* is a process module 1200 neighboring the first process modules 1200*a* with the buffer chamber 2000 therebetween.

When the substrate S is put in the process chamber 1230*b*, the process chamber 1230*b* performs the process in the operation S160. The process performed by the process chamber 1230*b* may be different from the process performed by the process chamber 1230*a*. When the buffer chamber 2000 performs a cleaning process by using plasma, the substrate S with a foreign substrate removed is put in the process chamber 1230*b*, so that the process chamber 1230*b* can efficiently perform the process.

The transfer chamber 1220*b* carries the substrate S from the process chamber 1230*b* to the load lock chamber 1210*b* in the operation S170, and the transfer module 1100 takes out the substrate S from the load lock chamber 1210*b*, and accommodates the substrate S in the container C in the operation S180. As such, the substrate S may pass through each of the first process module 1200*a*, the buffer chamber 2000, and the second process module 1200*b*, and be processed by each chamber.

Unless the buffer chamber 2000 is provided, the substrate S to be put in each process should be returned from the first process module 1200*a* to the transfer module 1100 through the load lock chamber 1210*a*, and then, be carried to the second process module 1200*b* through the load lock chamber 1210*b*. Thus, such returning and carrying of the substrate S is unnecessary according to the current embodiment to thereby decrease a treating time of the substrate S, thus increasing a substrate treating rate.

If necessary, after the process of the second process module 1200*b* is ended in the operation S160, the substrate S may be returned to the first process module 1200*a* through the buffer chamber 2000. Then, the first process module 1200*a* may perform a process on the substrate S in an operation S180*a*.

Referring FIG. 13, a third process module 1200*c* is added to the substrate treating apparatus 1000, and the first process module 1200*a*, the second process module 1200*b*, and the third process module 1200*c* are sequentially arrayed along a first direction X. In this case, instead of returning the substrate S to the transfer module 1100 after the process of the process chamber 1230*b* is ended in the operation S160, the substrate S may be carried to the third process module 1200*c* through a buffer chamber 2000 between the second process module 1200*b* and the third process module 1200*c* in an operation S170*b*. Accordingly, the substrate S is transferred to a process chamber 1230*c* of the third process module 1200*c* without being transferred to the transfer module 1100 in an operation S180*b*, and the third process module 1200*c* performs a process on the substrate S in an operation S190*b*.

Hereinafter, a substrate treating method will now be described according to another embodiment of the present invention. The substrate treating method is a method of treating a substrate S in a substrate treating system 100.

Figure 14:
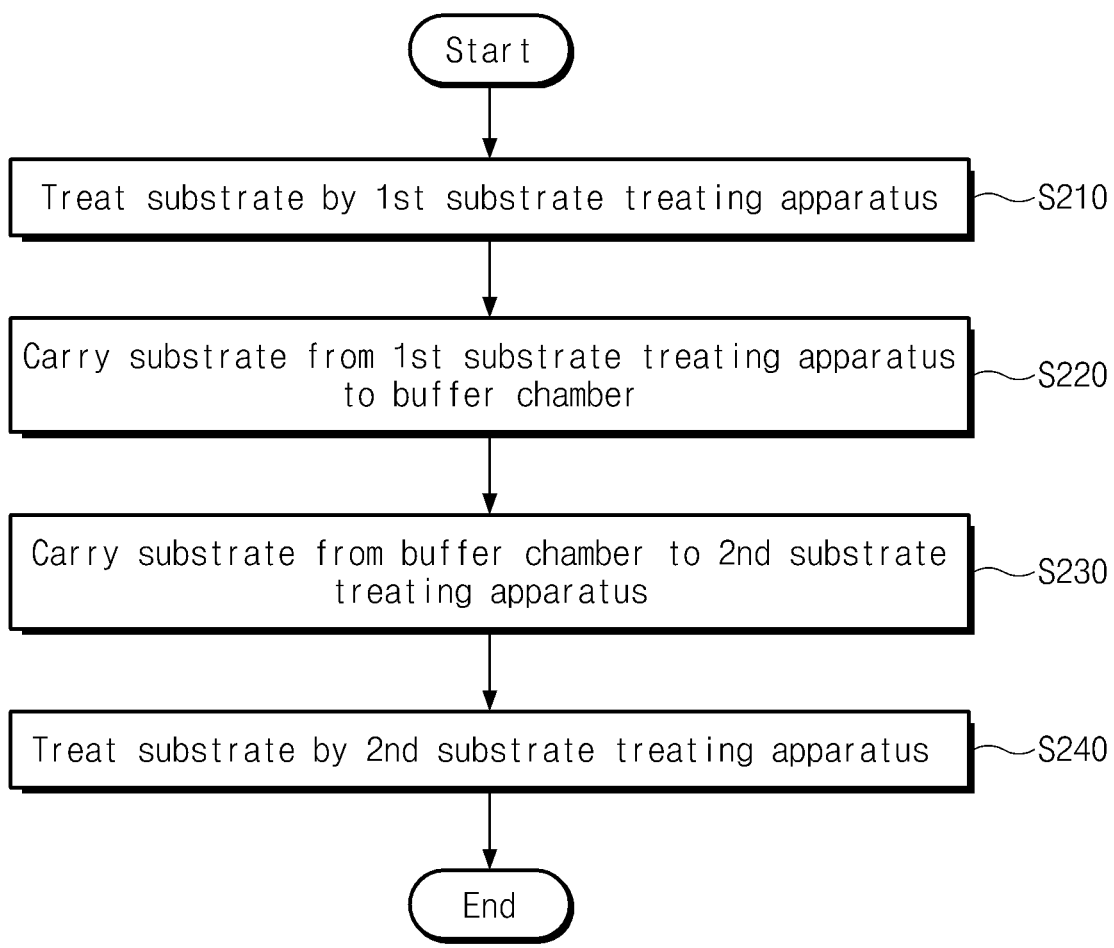
FIG. 14 is a flowchart illustrating a substrate treating method according to another embodiment of the present invention.

FIG. 14 is a flowchart illustrating the substrate treating method according to the current embodiment.

Referring to FIG. 14, the substrate treating method may include: an operation S210 of treating a substrate S by a first substrate treating apparatus 1000*a*; an operation S220 of carrying the substrate S from the first substrate treating apparatus 1000*a* to a buffer chamber 2000; an operation S230 of carrying the substrate S from the buffer chamber 2000 to a second substrate treating apparatus 1000*b*; and an operation S240 of treating the substrate S by the second substrate treating apparatus 1000*b*. Each operation will now be described in detail.

When an external carrier places a container C on a load port 1110 of the first substrate treating apparatus 1000*a*, the first substrate treating apparatus 1000*a* treats the substrate S in the operation S210. In particular, a transfer module 1100 of the first substrate treating apparatus 1000*a* may transfer the substrate S from the load port 1110 to a process module 1200, and a process chamber 1230 of the process module 1200 may perform a process on the substrate S. When the process is ended, a transfer chamber 1220 takes out the substrate S from the process module 1200. When the first substrate treating apparatus 1000*a* includes a plurality of process modules 1200, the substrate S to be treated may be carried between process chambers 1230 through a buffer chamber 2000 as in the previous embodiment.

When the treating of the substrate S is ended in the first substrate treating apparatus 1000*a*, the substrate S is carried from the first substrate treating apparatus 1000*a* to the buffer chamber 2000 in the operation S220. In particular, the transfer chamber 1220 of the first substrate treating apparatus 1000*a* takes out the substrate S from the process chamber 1230 of the first substrate treating apparatus 1000*a*, and puts the substrate S in the buffer chamber 2000 between the first and second substrate treating apparatuses 1000*a* and 1000*b*.

When the substrate S is put in the buffer chamber 2000, the buffer chamber 2000 may align the substrate S, or perform a process. When the buffer chamber 2000 does not have an aligning or processing function, the buffer chamber 2000 may function just as a passage for connecting the first and second substrate treating apparatuses 1000*a* and 1000*b*. When the first and second substrate treating apparatuses 1000*a* and 1000*b* have different inner pressure, the buffer chamber 2000 may perform a depressurizing function, like a load lock chamber 1210.

In the operation S230, the substrate S is carried from the buffer chamber 2000 to the second substrate treating apparatus 1000*b*. A transfer chamber 1220 of the second substrate treating apparatus 1000*b* may take out the substrate S from the buffer chamber 2000, and put the substrate S in the second substrate treating apparatus 1000*b*.

In the operation S240, the second substrate treating apparatus 1000*b* treats the substrate S. In particular, the transfer chamber 1220 of the second substrate treating apparatus 1000b may carry the substrate S to a process chamber 1230 of the second substrate treating apparatus 1000b, and the process chamber 1230 may perform a process on the substrate S. When the process is ended, the transfer chamber 1220 of the second substrate treating apparatus 1000b transfers the substrate S to a load lock chamber 1210 of the second substrate treating apparatus 1000b, and a transfer module 1100 of the second substrate treating apparatus 1000b takes out the substrate S from the load lock chamber 1210, and accommodates the substrate S in a container C installed on a load port 1110 of the second substrate treating apparatus 1000b.

The substrate treating system 100 may include a third substrate treating apparatus 1000c connected to the second substrate treating apparatus 1000b with a buffer chamber 2000 therebetween. In this case, instead of accommodating the substrate S in the container C after the second substrate treating apparatus 1000b treats the substrate S, the substrate S may be carried to the third substrate treating apparatus 1000c through the buffer chamber 2000 disposed between the second and third substrate treating apparatuses 1000b and 1000c in an operation S250, and be treated by the third substrate treating apparatus 1000c.

According to the embodiments, a substrate S can be carried between the substrate treating apparatuses 1000 of the substrate treating system 100, without using a carrier member such as an overhead transfer, and be directly transferred from a process module 1200 of each substrate treating apparatus 1000 to a process module 1200 of another substrate treating apparatus 1000. Thus, the substrate S can be continuously treated, thereby improving process efficiency.

According to the embodiments, since a substrate can be directly carried between process modules through a buffer chamber, a carrying path of the substrate can be decreased so as to improve process efficiency.

In addition, since a substrate can be directly carried between substrate treating apparatuses through a buffer chamber, without being transferred to an external carrier such as an overhead transfer, a carrying path of the substrate can be decreased so as to improve process efficiency.

In addition, a buffer chamber used as a space for carrying a substrate performs a process during the carrying of the substrate, so as to improve foot print efficiency, thus increasing a substrate treating rate.

In addition, a buffer chamber used as a space for carrying a substrate performs a process before or after a process performed by a process chamber, so that the processes can be continuously performed.

In addition, since a substrate is cleaned through a plasma process in a buffer chamber so as to remove a foreign substance formed in a previous process, the substrate can be directly put in a subsequent process.

However, the present invention is not limited thereto, and thus, other effects not described herein would be clearly understood by those skilled in the art from the above descriptions and the accompanying drawings.

The above-described embodiments are given so that those of skill in the related art could easily understand the present invention, and are not intended to limit the present invention. Thus, the embodiments and elements thereof can be used in other ways or with known technology, and various modifications and changes in form and details can be made without departing from the scope of the present invention.

In addition, the scope of the present invention is defined by the following claims, and all differences within the scope will be considered as being included in the present invention.

What is claimed is:

1. A substrate treating apparatus comprising:
   a load port on which a container containing a substrate is installed;
   a plurality of process modules configured to treat the substrate;
   a transfer module disposed between the load port and the process modules, and configured to transfer the substrate between the container and the process modules; and
   a buffer chamber disposed between neighboring ones of the process modules, and configured to provide a space for carrying the substrate between the neighboring process modules,
   wherein the buffer chamber comprises:
      a lower housing;
      a lower support member disposed in the lower housing, and supporting the substrate;
      a rotation member configured to rotate the substrate placed on the lower support member;
      an upper housing vertically stacked on the lower housing;
      an upper support member disposed in the upper housing, and supporting the substrate;
      a heating member configured to heat the substrate placed on the upper support member; and
      a plasma supplier configured to supply plasma to the upper housing for performing a plasma process.

2. The substrate treating apparatus of claim 1, wherein the load port, the transfer module, and the process modules are sequentially arrayed along a second direction (Y-axis direction), and
   wherein the process modules are arrayed in a straight line at a side of the transfer module along a first direction perpendicular to the second direction in plan view.

3. The substrate treating apparatus of claim 2, wherein each of the process modules comprises:
   a transfer chamber configured to transfer the substrate between chambers disposed around the transfer chamber;
   a plurality of process chambers disposed around the transfer chamber to treat the substrate; and
   a load lock chamber disposed between the transfer module and the transfer chamber,
   wherein the buffer chamber is disposed between the transfer chambers of the neighboring process modules.

4. The substrate treating apparatus of claim 1, wherein the lower housing provides a buffer space in which the substrate carried between the neighboring process modules temporarily stays.

5. A substrate treating system comprising:
   a plurality of substrate treating apparatuses each comprising:
      a load port on which a container containing a substrate is installed;
      a process module configured to treat the substrate; and
      a transfer module disposed between the load port and the process module, and configured to transfer the substrate between the container and the process module, and
   a first buffer chamber disposed between neighboring ones of the substrate treating apparatuses, and configured to provide a space for carrying the substrate between the neighboring substrate treating apparatuses, wherein the process module comprises:
- a transfer chamber configured to transfer the substrate between chambers disposed around the transfer chamber;
- a plurality of process chambers disposed around the transfer chamber to treat the substrate; and
- a load lock chamber disposed between the transfer module and the transfer chamber, wherein the first buffer chamber is disposed between the transfer chambers of the neighboring substrate treating apparatuses, and wherein the first buffer chamber comprises:
- a lower housing;
- a lower support member disposed in the lower housing, and supporting the substrate;
- a rotation member configured to rotate the substrate placed on the lower support member;
- an upper housing vertically stacked on the lower housing;
- an upper support member disposed in the upper housing, and supporting the substrate;
- a heating member configured to heat the substrate placed on the upper support member; and
- a plasma supplier configured to supply plasma to the upper housing to perform a plasma process.

6. The substrate treating system of claim 5, wherein the load port, the transfer module, and the process module are sequentially arrayed along a second direction (Y-axis direction), and
wherein the substrate treating apparatuses are arrayed in a straight line along a first direction perpendicular to the second direction.

7. The substrate treating system of claim 6, wherein the lower housing provides a buffer space in which the substrate carried between the neighboring substrate treating apparatuses temporarily stays.

8. The substrate treating system of claim 5, wherein the process module included in the substrate treating apparatus is provided in plurality, and
wherein the substrate treating apparatus further comprises a second buffer chamber that is disposed between neighboring ones of the process modules included in the same substrate treating apparatus, and that provides a space for carrying the substrate between the neighboring process modules.

9. The substrate treating system of claim 8, wherein
the second buffer chamber is disposed between the neighboring process modules.

* * * * *